United States Patent
Diglio et al.

(10) Patent No.: US 12,000,487 B2
(45) Date of Patent: Jun. 4, 2024

(54) SYSTEM AND APPARATUS HAVING A SEAL MEMBER FOR SEALING OF A DEVICE UNDER TEST

(71) Applicant: Intel Corporation, Santa Clara, CA (US)

(72) Inventors: Paul Diglio, Gaston, OR (US); Craig Yost, Gilbert, AZ (US); Christopher Wade Ackerman, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/895,104

(22) Filed: Aug. 25, 2022

(65) Prior Publication Data

US 2024/0068572 A1 Feb. 29, 2024

(51) Int. Cl.
*F16J 15/328* (2016.01)
(52) U.S. Cl.
CPC .................. *F16J 15/328* (2013.01)
(58) Field of Classification Search
CPC .......... F16J 15/328; F16J 15/02; F16J 15/021; F16J 15/022
See application file for complete search history.

(56) References Cited

U.S. PATENT DOCUMENTS

| | | | | |
|---|---|---|---|---|
| 2015/0276798 A1* | 10/2015 | Song | ................ | G01R 1/04 324/750.08 |
| 2020/0146183 A1* | 5/2020 | Lofgreen | ........... | H05K 7/20254 |
| 2021/0348624 A1* | 11/2021 | Diglio | .................. | F04D 29/588 |
| 2021/0351106 A1* | 11/2021 | Subrahmanyam | .... | H01L 23/427 |
| 2021/0351108 A1* | 11/2021 | Diglio | ................ | H01L 23/4735 |

\* cited by examiner

*Primary Examiner* — Gilbert Y Lee
(74) *Attorney, Agent, or Firm* — VIERING, JENTSCHURA & PARTNER MBB

(57) ABSTRACT

The present disclosure is directed to a system having a first loading component and a second loading component for applying load to a device during a test of the device, the first loading component is configured to be moveable with respect to the second loading component. The system includes a seal member arranged between the first loading component and the second loading component, the seal member is adapted to engage the device during testing so as to apply a load against the device during testing and provide sealing around a cavity positioned below the first loading component and above the device.

20 Claims, 10 Drawing Sheets

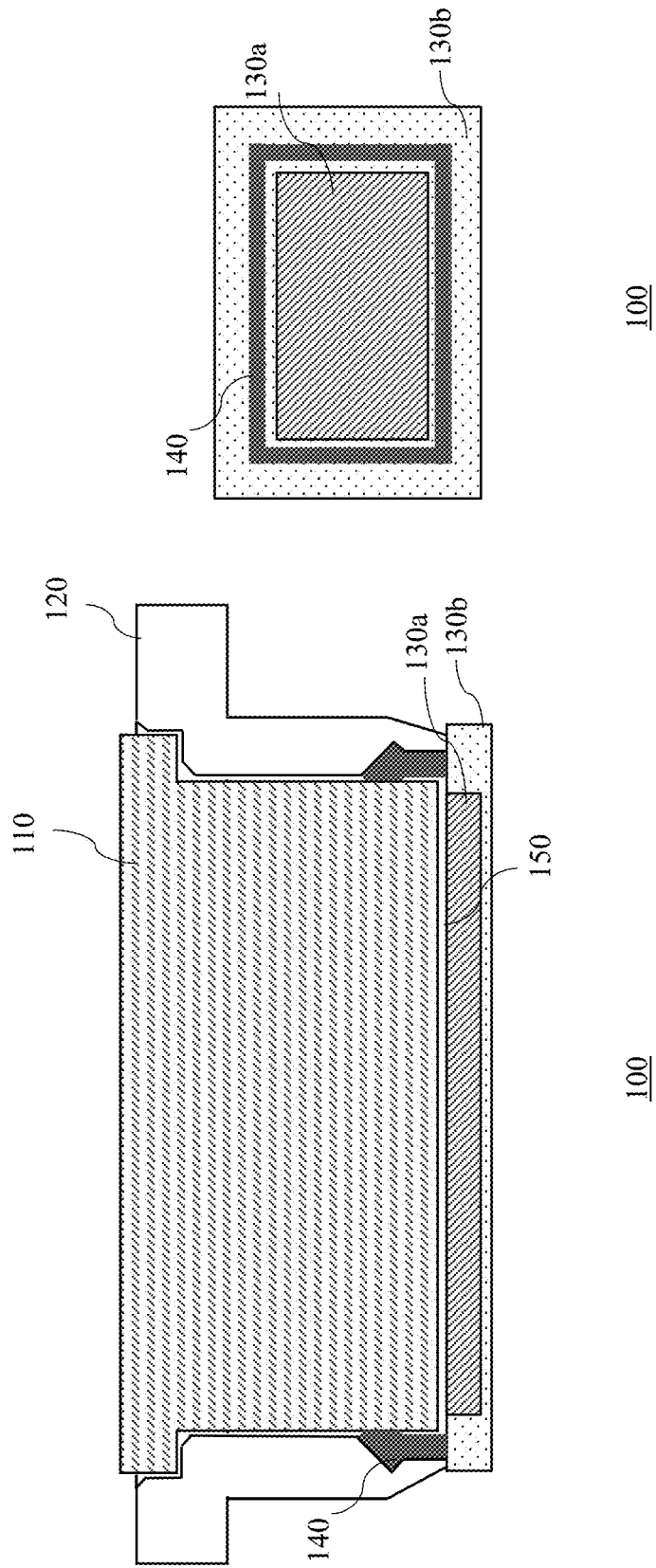

SYSTEM AND APPARATUS HAVING A SEAL MEMBER FOR SEALING OF A DEVICE UNDER TEST

BACKGROUND

Direct fluid cooling for device management (especially at sort and test) is becoming increasingly more in demand, for example, with device thermal densities following technology node scaling closely. Thermal densities are expected to exceed 40 W/mm² within the next few years with the problem expected to be exasperated with complex three-dimensional (3D) packaging. However, direct fluid impingement poses some challenges as it requires a seal directly on and around the device under test (DUT). Additionally, for testing requirements, the packages may require independent die and package loading to properly distribute the load across the device such that package damage is mitigated but pin closure (for test sockets) is electrically satisfied. Thus, the sealed environment to the DUT must encompass both the package and thermal head but also allow for separate loading (and thus sealing) for the die and package load actuations.

In conventional techniques, two or more sealing elements, i.e., multiple seals, are employed to conceal the environment above the DUT while providing independent die and package loading required to satisfy test needs, which becomes complex and unreliable in use (e.g., more surfaces to enclose). Further, if these sealing elements are custom seals per product, it results in excessive tooling cost. For example, the sealing elements may be production specific and limit design space for other needs (will need additional real-estate or space to account for the additional seals required).

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which:

FIG. 1C shows a cross-section view of another exemplary system according to an aspect of the present disclosure;

FIG. 1D shows a top view of an exemplary seal member against a device according to an aspect of the present disclosure;

DETAILED DESCRIPTION

Figure 1A:
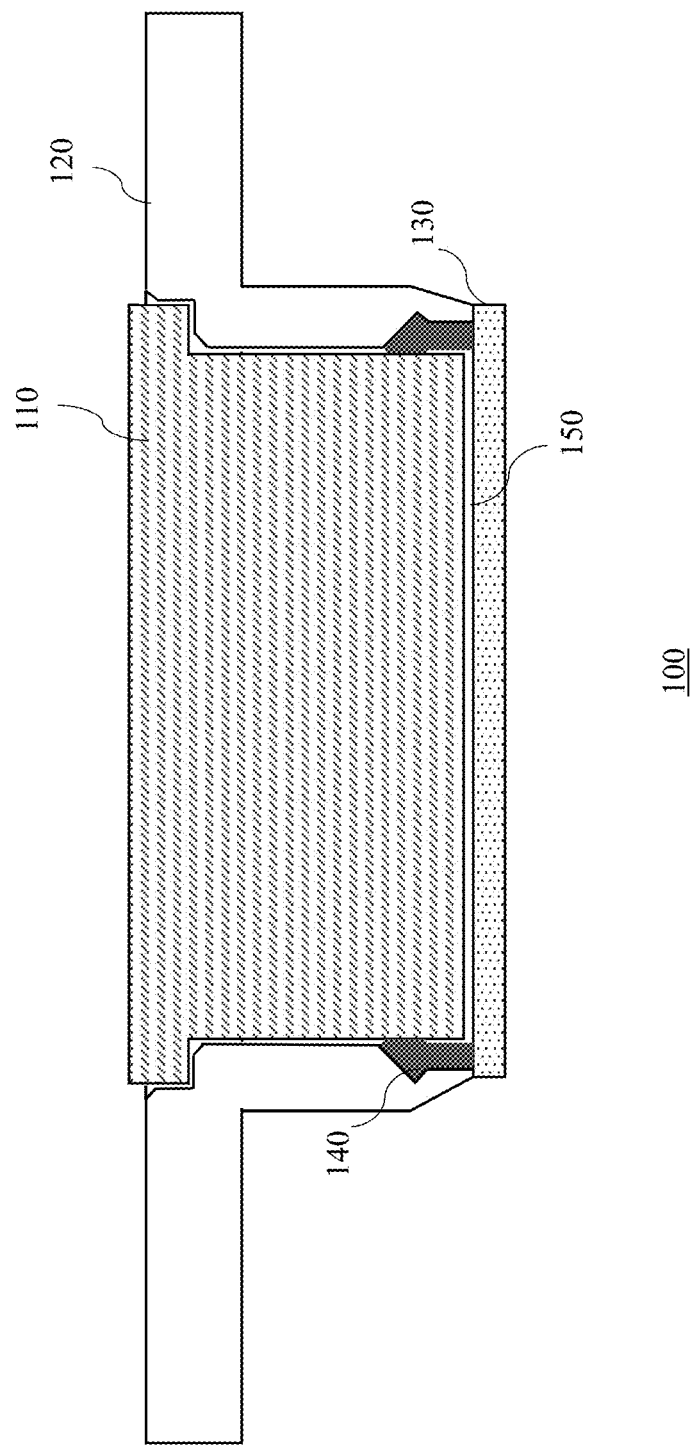
FIG. 1A shows a simplified cross-section view of an exemplary system according to an aspect of the present disclosure.

The following detailed description refers to the accompanying drawings that show, by way of illustration, specific details, and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

Various embodiments provide a system having a seal member arranged between a first loading component and a second loading component, and in which the first loading component is configured to be moveable with respect to the second loading component. The seal member is adapted to engage a device during testing so as to apply a load against the device during testing and provide sealing around a cavity positioned below the first loading component and above the device.

According to various embodiments, the system may be a thermal control system. For example, the system may be used for thermal control or thermal solution of a device under test.

In another aspect, various embodiments provide a device test apparatus having a thermal head including first and second loading components for applying load to a device during a test of the device, one or more fluid channels extending through the first loading component to permit flow of fluid or coolant from an external source to the cavity below the first loading component and above the device, a seal member arranged between the first loading component and the second loading component, the seal member engaging the first loading component and the second loading component. The seal member is adapted to engage the device during testing so as to apply a load against the device during testing and provide sealing around the cavity below the first loading component and above the device. The first loading component is configured to be moveable with respect to the second loading component. The first loading component and the second loading component may apply a load to the device under test via the seal member which directly engages or contacts the device under test. The device test apparatus may further include a test socket adapted to connect to a die of the device during testing, and a controller adapted to drive the testing of the die through the test socket.

According to various embodiments, the device test apparatus may be for performing test on a device and including the thermal control system. For example, the device test apparatus may be used for thermal control of a device under test. The apparatus may further include device, socket (which the device electrically couples to), a printed circuit board (PCB) that routes signals from the device under test to a tester. The device test apparatus may further include one or more controllers to control the flow, fluid temperature and pressure of cooling fluid.

Various embodiments may be used to facilitate direct fluid interaction at the device under test. For example, the system and the device test apparatus may be used for direct cooling technologies such as one-phase and two-phase direct impingement applications for device thermal management, such as for testing. The seal member may constrain the fluid in the cavity above the device during testing.

A technical advantage of the present disclosure includes using a single seal member which is arranged between two loading components (e.g., the first loading component and second loading component as described hereinbefore according to various embodiments) of the system, or the device test apparatus, to provide a sealed environment to a device under test while maintaining independent motion between the two loading components. For example, the two loading components may be inner and outer loading mechanisms. Accordingly, the system, as well as the device test apparatus as described, may allow independent vertical motion between the inner and outer loading mechanisms. Therefore, various embodiments facilitate independent loading of device components of the device under test using one seal arranged between the two loading components. For example, independent die and package (e.g., stiffener) loading may be performed since motion of the first and second loading components of the system or device test apparatus may be performed independently.

An additional technical advantage of the present disclosure includes the ease to adapt to various products and require a single seal per kit.

A further technical advantage of the present disclosure includes the seal member being able to be adapted and modified based on specific needs of each kit/setup (e.g., the height, width, stiffness, etc. of the seal member), i.e., fully adjustable.

To more readily understand and put into practical effect the present seal member of the system, which may be used for test device apparatuses, particular aspects will now be described by way of examples provided in the drawings that are not intended as limitations. The advantages and features of the aspects herein disclosed will be apparent through reference to the following descriptions relating to the accompanying drawings. Furthermore, it is to be understood that the features of the various aspects described herein are not mutually exclusive and can exist in various combinations and permutations. For the sake of brevity, duplicate descriptions of features and properties may be omitted.

FIG. 1A shows a simplified cross-section view of an exemplary system 100 according to an aspect of the present disclosure. The system includes a first loading component 110 and a second loading component 120, such as for applying load to a device 130 during a test of the device. The first loading component 110 may be configured to be moveable with respect to the second loading component 120. For example, the first loading component 110 may be an inner loading mechanism of the system 100, while the second loading component 120 may be an outer loading mechanism of the system 100. A seal member 140 may be arranged between the first loading component 110 and the second loading component 120. The seal member 140 may be adapted to engage the device 130 during testing so as to apply a load against the device during testing and provide sealing around a cavity 150 positioned below the first loading component and above the device. Accordingly, the system 100 including the first loading component 110, the second loading component 120 and the seal member 140 may provide a sealed environment to the device under test 130.

As illustrated, the seal member 140 may engage or contact a surface of the device under test 130. The seal member 140 may contact or engage any surface of the device under test 130 such as package, package substrate, stiffener, epoxy, die (e.g., silicon), fillet, mold, underfill, etc.

Figure 1B:
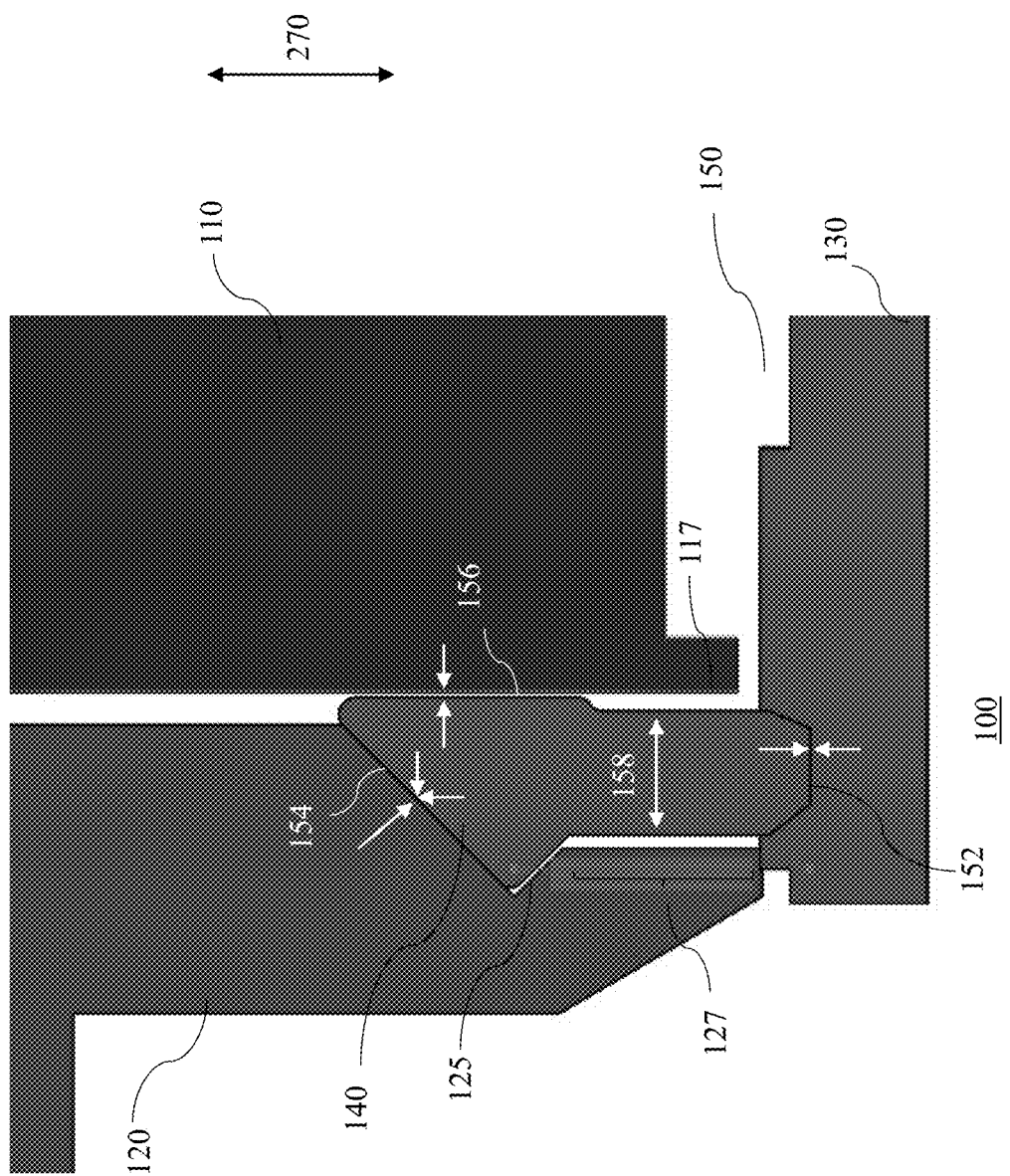
FIG. 1B shows an expanded cross-section view of the exemplary system according to an aspect of the present disclosure.

FIG. 1B shows an expanded cross-section view of the exemplary system 100 according to an aspect of the present disclosure. According to various embodiments, the seal member 140 may include three surfaces (e.g., mating surfaces), which are engaged simultaneously when in use. The seal member 140 may include a first seal contact surface 152, a second seal contact surface 154, and a third seal contact surface 156. The first seal contact surface 152, the second seal contact surface 154, and the third seal contact surface 156 may mate or engage with three different components. As illustrated in FIG. 1B, the first seal contact surface 152 of the seal member 140 may be adapted to engage or contact the device under test, the second seal contact surface 154 may be adapted to engage or contact an exterior wall (e.g., the second loading component 120), and the third seal contact surface 156 may be adapted to engage or contact an interior wall of the system (e.g., the first loading component 110). The exterior wall of the system may be stationary, while the interior wall may be movable (e.g., vertically movable when in use) with respect to the exterior wall.

When in use, the first seal contact surface 152, the second seal contact surface 154, and the third seal contact surface 156 are engaged simultaneously with load applied to the first seal contact surface 152. For example, the seal member 140 may include a vertical section which may contact a temporary surface, i.e., surface of the device under test (e.g., a device package), and compress.

According to various embodiments, the second seal contact surface 154 engaging or bearing against the second loading component 120 may create a reaction force which provides lateral force (e.g., squeeze force) and compression to the third seal contact surface 156 engaging or bearing against the first loading component 110. The second seal contact surface 154 may have an angle which provides lateral force and compression to the third seal contact surface 156. For example, the second seal contact surface 154 may have an angle ranging from about 0 degrees to about 89 degrees with respect to a longitudinal axis (e.g., vertical axis with respect to a horizontal plane) extending between the first seal contact surface 152 and the second seal contact surface 154, which when engaged will squeeze the seal member sufficiently. For example, the second seal contact surface 154 may have an angle of about 45 degrees with respect to a longitudinal axis (e.g., vertical axis with respect to a horizontal plane) extending between the first seal contact surface 152 and the second seal contact surface 154.

The second loading component 120 may include a recess for receiving the seal member 140. In other worlds, the second loading component 120 may include a mechanical retention portion 125 arranged around the seal member to provide corresponding retention, loading and sealing mechanisms or surfaces. In the mechanical retention portion 125, the second loading component 120 may include a surface having an angle (e.g., angled surface of the second loading component 120) which matches the angle of the second seal contact surface 154 of the seal member 140. The seal member 140 may engage or contact the angled surface of the second loading component 120 (and therefore also seal to) as the angled surface of the second loading component 120 and the angle of the second seal contact surface 154 of the seal member matches (e.g., mating surfaces).

The mechanical retention and loading mechanisms may have provisions to hardstop (prevent seal over compression). For example, the exterior wall or second loading component 120 may extend down to almost the length of the seal member 140. When loaded, the seal member 140 may compress until a mating surface of a lower section of the seal member contacts a lower end section 127 of the exterior wall, which is stationary. In other words, the lower end section 127 of the second loading component 120 may serve as a hardstop preventing further compression of the seal member. The retention mechanism may provide inner and outer barriers for the seal member to prevent seal failure (e.g., blow-out) under pressurized or evacuated conditions. For example, the lower end section 127 of the second loading component 120 and a lower end section 117 of the first loading component 110 may serve as the outer and inner barriers, respectively.

The interior wall may maintain a flat mating surface (e.g., orthogonal to the first seal contact surface 152) with the seal member. The interior wall may be located on the first loading component 110. The seal member may have a vertical coupling with the first loading component 110 at the third seal contact surface 156 and as such the first loading component 110 may be impartial to where the seal member physically contacts it. Therefore, the interior wall of the system (e.g., the first loading component 110) may translate up and down (even during use) independently of the seal member and the exterior walls and still create a hermetically sealed system. This is directly used to facilitate the ability for an independent device die loading versus a package loading while only requiring one system to secure both loading components and device (under test) from the outside or external environments. The third seal contact surface 156 may be adapted to allow mechanical movement (e.g., vertically) with respect to the first seal contact surface 152 and the second seal contact surface 154.

To allow for seal compression, an expansion space may be provided over the first seal contact surface 152 as the seal member will expand in the width direction 158. For example, the expansion space is illustrated as air gaps on the left and right of the lower section of the seal member in FIG. 1B.

The seal member may extend from the second loading component 120 to contact the device during testing along one along one of package surfaces, including the die, a stiffener, a substrate, an underfill or other components of the device. FIG. 1C shows a cross-section view of another exemplary system 100 according to an aspect of the present disclosure. In a non-limiting example, the device may include a die 130a mounted on a package 130b. The seal member 140, for example, may extend from the second loading component 120 and may contact the package 130b during testing. FIG. 1D shows a top view of an exemplary seal member against a device having a die and a package, according to an aspect of the present disclosure. The seal member 140 may extend along a surface of the package, as illustrated in FIG. 1D. In other examples, the seal member 140 may be configured to contact the device within the die perimeter. The seal member may contact any surface on the device under test (e.g., stiffener, package, package substrate, die, etc.) depending on what areas of the die require strong cooling in addition to where the load should be applied. The sizes of the first and second loading components and the seal member may be appropriately sized according to the size of the device or components of the device such as the die, the package, the substrate, etc.

Figure 2B:
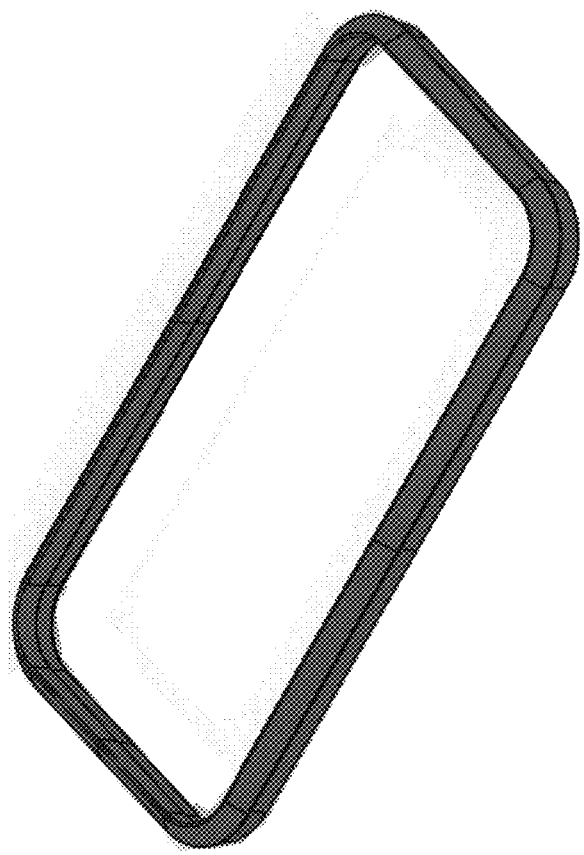
FIGS. 2B-2C show perspective views of the seal member according to an aspect of the present disclosure.
Figure 2A:
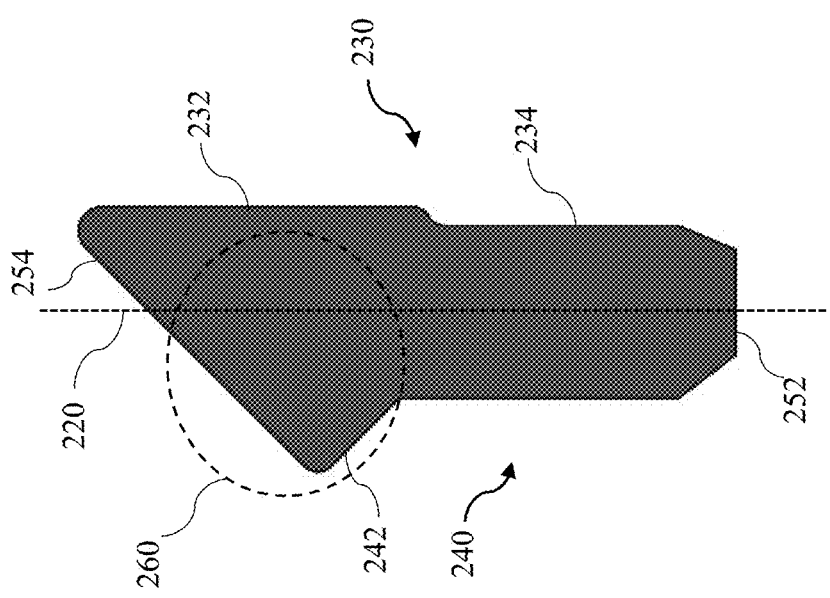
FIG. 2A shows an expanded cross-section view of an exemplary seal member according to an aspect of the present disclosure.
Figure 2C:
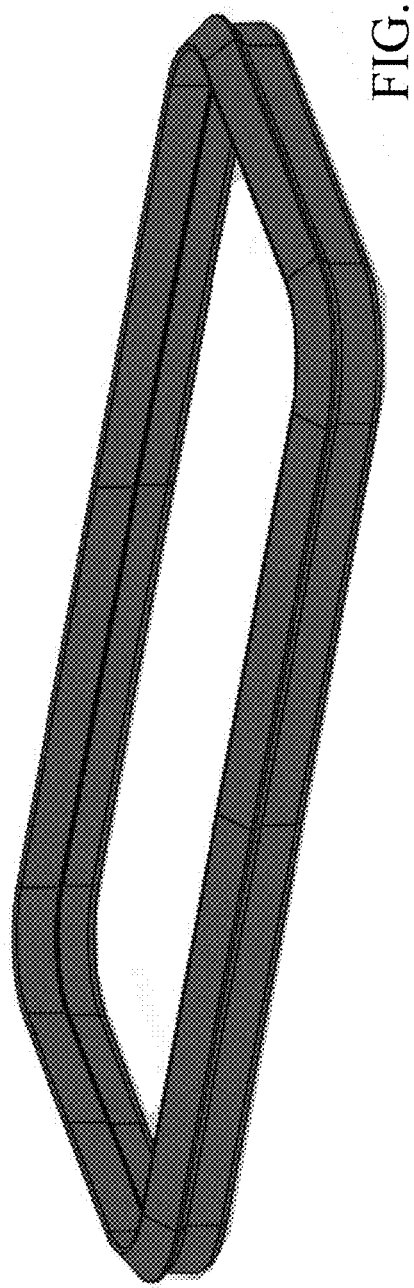
Figure 2D:
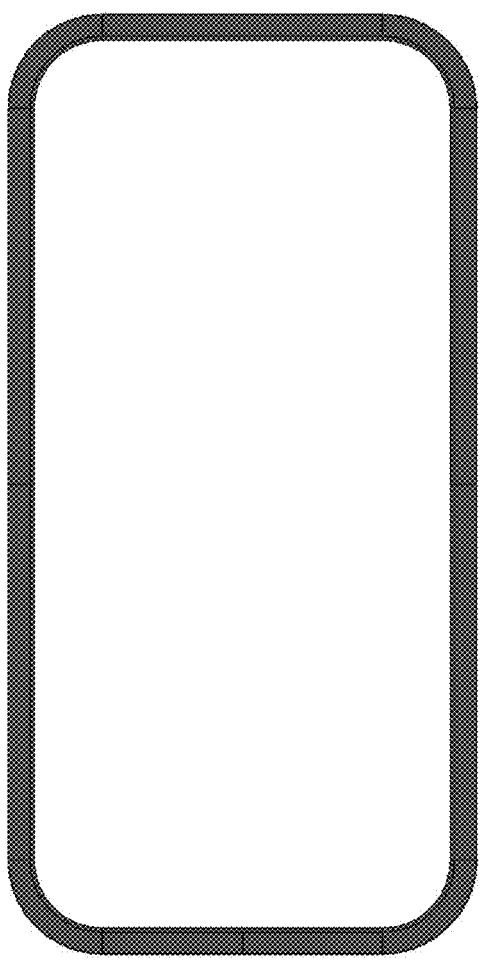
FIG. 2D shows a top view of the seal member according to an aspect of the present disclosure.

FIG. 2A shows an expanded cross-section view of the seal member 140 according to an aspect of the present disclosure. FIGS. 2B-2C show perspective views of the seal member 140 according to an aspect of the present disclosure. FIG. 2D shows a top view of the seal member 140 according to an aspect of the present disclosure.

Referring to FIG. 2A, the seal member includes first and second opposing surfaces 252 and 254. The first surface 252 may be, or include, the first seal contact surface 152 described with respect to FIG. 1B, while the second surface 254 may be, or include, the second seal contact surface 154 described with respect to FIG. 1B. The second surface 254 may be slanted at an angle with respect to a longitudinal axis 220 extending between the first and second surfaces 252 and 254. The second surface 254 may engage with a surface of the second loading component, and the seal member may be adapted to engage the device during testing at the first surface 252. The seal member may include first and second opposing sidewalls 230 and 240. The first sidewall 230 includes a substantially planar first side portion 232 to facilitate vertical movement 270 of the first loading component with respect to the top surface of the device during testing. The first side portion 232 may include the third seal contact surface 156 described with respect to FIG. 1B. The first side portion 232 of the first sidewall may be substantially co-planar with a first sidewall of the second loading component (e.g., exterior wall of the system) to facilitate movement of the first loading component. The second sidewall 240 may include a slanted side portion 242 with respect to the planar first side portion 232 of the first sidewall.

According to various embodiments, the seal member 140 may include a lip portion 260 adapted to mate with a mechanical retention portion in the second loading component such that the seal member is retained in place between the first loading component and the second loading component when the first loading component moves. The lip portion 260 may be provided for mechanical retention. The lip portion 260 may prevent the seal member falling or be pulled out of position once assembled. As illustrated in FIG. 2A, the slanted side portion 242 of the second sidewall adjoins the second surface 254 to form the lip portion 260 of the seal member. For example, the slanted side portion 242 of the second sidewall adjoins the second surface 254, forming a chamfered corner of the lip portion. Accordingly, another technical advantage of the present disclosure includes the seal member being self-retaining or self-capturing. In this regard, the seal member cannot become loose or dislodge over time.

The seal member may include a lower section beneath an upper section. The first surface 252 may be positioned at the lower section and the lip portion 260 may be positioned at the upper section. The lower section may be a vertical section.

The lower section may have a width that is smaller than (or less than) a maximum width of the upper section to facilitate expansion and retention of the seal member. The first sidewall 230 may further include a second side portion 234 (e.g., located in the lower section of the seal member), such that the first side portion 232 is elevated with respect to the second side portion 234 so as to provide an upper section which is wider than the lower section, forming a step therebetween. The step may facilitate or serve as the expansion space of the seal member. In a non-limiting example, the step may have a width (e.g., distance between the first side portion 232 and the second side portion 234 of the first sidewall 230) of about 100 ums or more (e.g., expected range may be about 0 to about 500 ums). The first sidewall 230 adjoins the second surface 254, forming a further chamfered corner.

As described, the first loading component and the second loading component may apply a load to the device under test via the seal member which directly engages or contact the device under test. According to various embodiments, load may be applied, for example, externally via air cylinders, to the bottom surface of the seal member to the device under test which in return applies the necessary load to seal the first and second loading components internally. In other examples, the required loading may be applied or induced by other mechanisms such as stages, springs, etc.

Referring to FIGS. 2B-2D, the seal member has a ring configuration. For example, the seal member has a continuous ring configuration so as to provide hermetic sealing when assembled between the first and second loading components and engaged to the device under test. The seal member may be configured to conform to the shape of the first loading component. For example, the seal member 140 is illustrated to have a rectangular shape. However, it is understood that other shapes with a continuous ring configuration may be used. The first loading component may define the overall shape of the seal member and the second loading component may be passively molded to the first loading component with the seal member located in between the two components.

The seal member may be an elastomeric seal. In a non-limiting example, the seal member may be formed of silicon rubber, nitrile, polyurethane, silicone, polytetrafluoroethylene (PTFE), etc. The seal member may have durometers ranging from about Shore 0 A to 100 A.

Figure 3A:
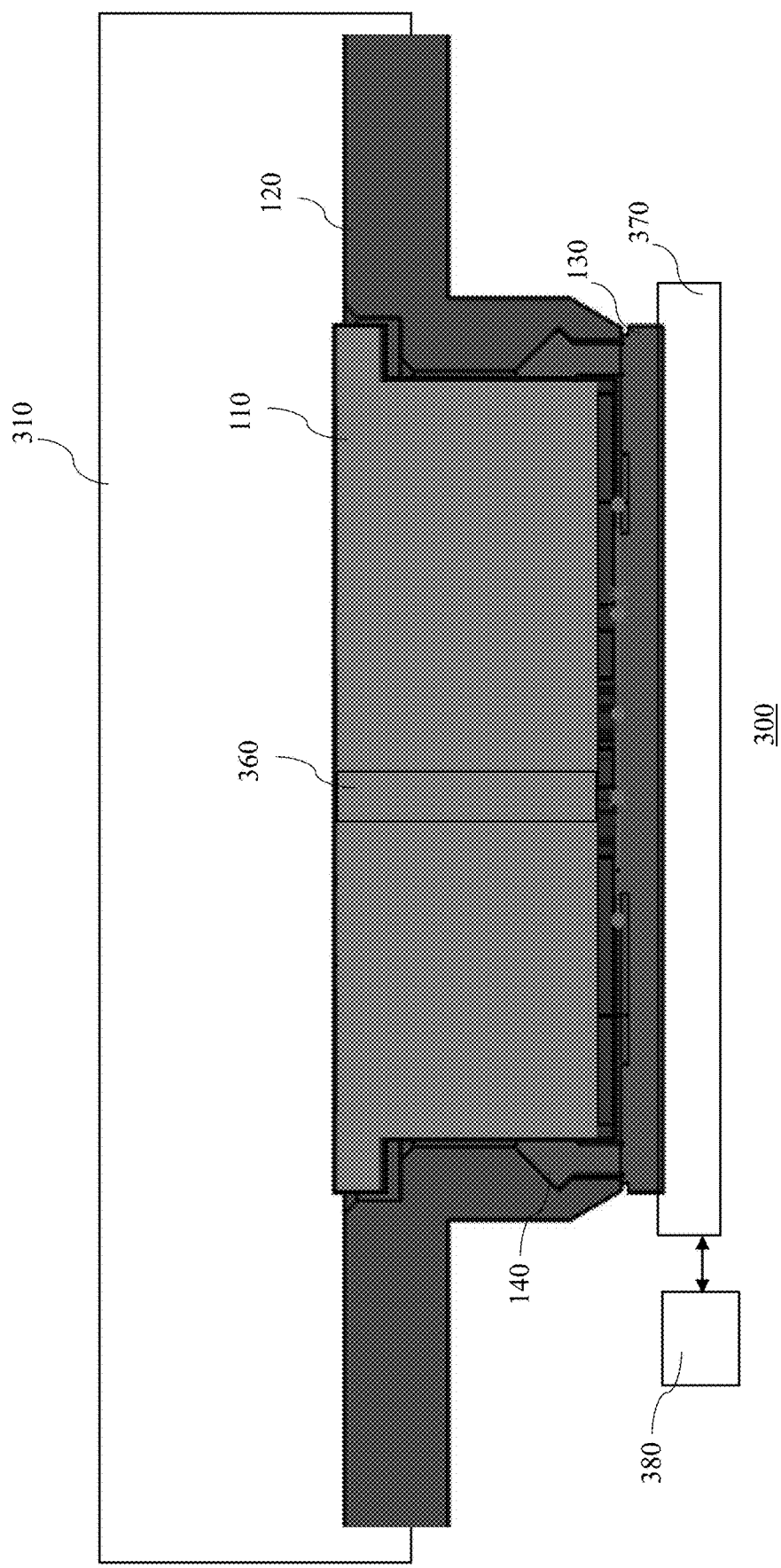
FIGS. 3A-3B show cross-sections views of a device test apparatus according to an aspect of the present disclosure.
Figure 3B:
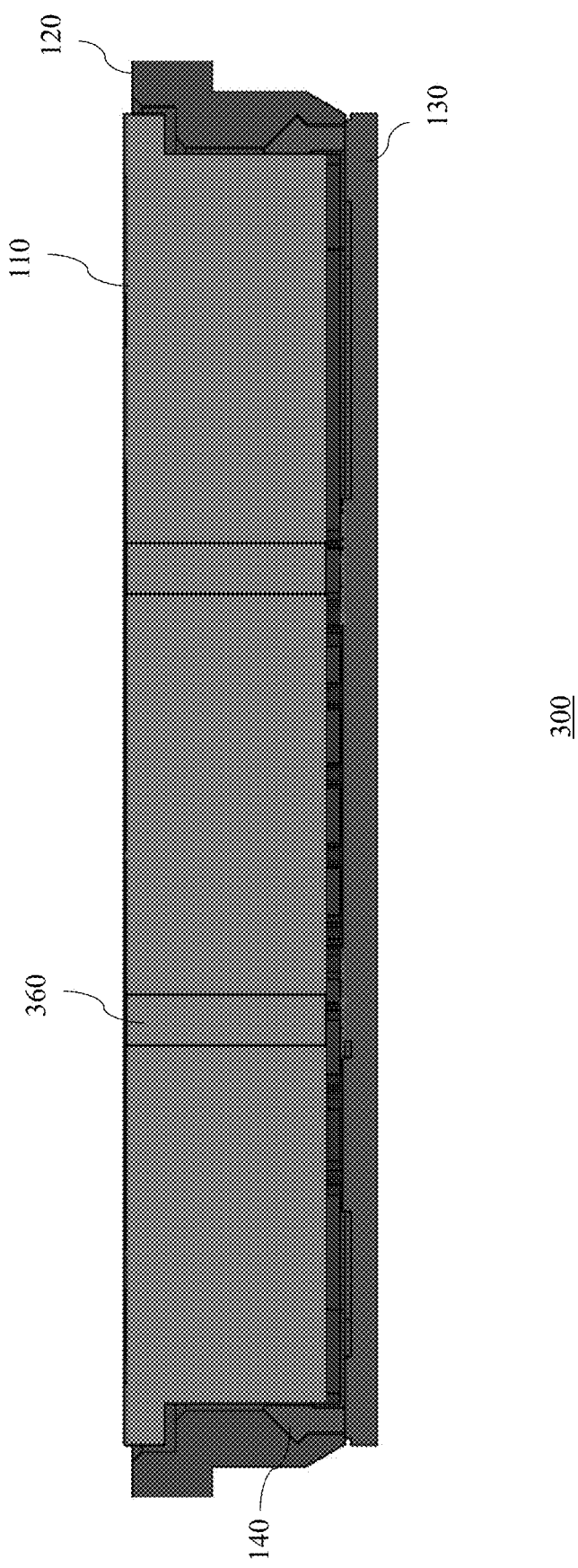
Figure 3C:
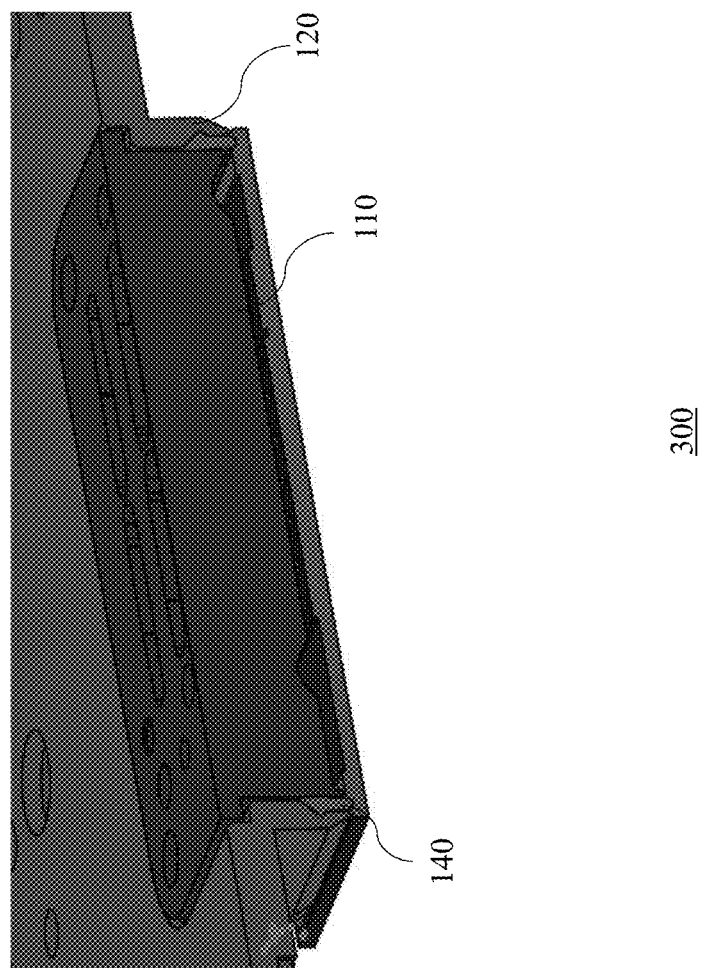
FIG. 3C shows a perspective view of the device test apparatus according to an aspect of the present disclosure.

FIGS. 3A-3B show cross-sections views of a device test apparatus 300 having the seal member 140 arranged between the first loading component 110 and the second loading component 120 according to an aspect of the present disclosure. FIG. 3C shows a perspective view of the device test apparatus 300 having the seal member 140 arranged between the first loading component 110 and the second loading component 120 according to an aspect of the present disclosure.

Referring to FIG. 3A, the device test apparatus 300 includes a thermal head 310 comprising first and second loading components 110 and 120 for applying load to a device 130 during a test of the device. The first loading component 110 is configured to be moveable with respect to the second loading component 120. The device test apparatus 300 may include one or more fluid channels 360 extending through the first loading component 110 to permit flow of fluid from an external source to a cavity below the first loading component and above the device 130. A seal member 140 as described according to various embodiments may be arranged between the first loading component 110 and the second loading component 120, the seal member engaging the first loading component 110 and the second loading component 120. The seal member is adapted to engage the device during testing so as to apply a load against the device during testing and provide sealing around the cavity above the device. The device test apparatus 300 may further include a test socket 370 adapted to connect to a die of the device 130 during testing, and a controller 380 adapted to drive the testing of the die through the test socket.

As illustrated, the sealed environment to the device under test 130 encompasses both the device 130 and the thermal head 310, and the device test apparatus 300 allows for separate/independent loading for the device 130 via the first loading component 110 and the second loading component 120. For example, the device test apparatus 300 allows for independent loading for the die and package load actuations.

The device test apparatus 300 may further include a pump coupled to the one or more fluid channels to pump fluid into the cavity above the device. Although not shown, it should be understood that the device test apparatus 300 may include other components which may be provided to complete the assembly for performing a test on the device. For example, the device test apparatus 300 may be used to perform direct fluid cooling for the device under test. In other examples, the device test apparatus 300 may be used for other fluid interactions, which may include channels, cavities, circulating pool, etc., in addition to impingement.

Figures 4, 5:
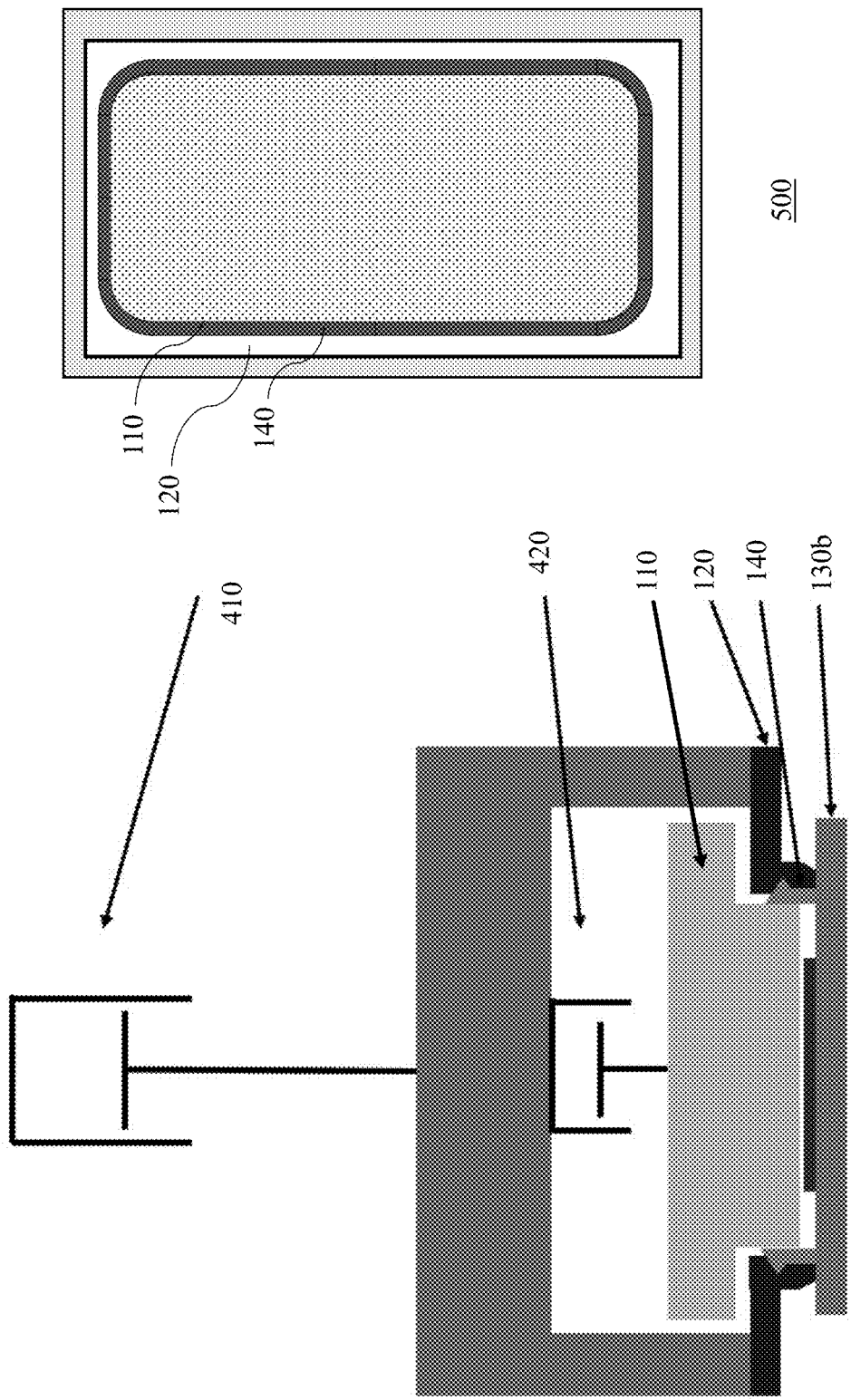
FIG. 4 shows a simplified loading schematic of a first loading component and a second loading component according to an aspect of the present disclosure.
FIG. 5 shows a cross-section top view of another exemplary system according to an aspect of the present disclosure.

The first and second loading components may be components of a thermal head. The thermal head may globally translate vertically via a relatively large primary air cylinder that both moves and applies load based on an input pressure provided. For example, the first loading component moves in addition to the movement of the thermal head via a second air cylinder (e.g., relatively much smaller than the primary air cylinder) that only imparts force to the first loading component. FIG. 4 shows a simplified loading schematic of the first and second loading components. For example, a first loading cylinder 410 may be used to apply load to the entire thermal head assembly. The force induced by the first loading cylinder 410 is greater than force induced by a second loading cylinder 420. The second loading cylinder 420, for example, may impart load only on the first loading component 110. The force is less than that induced by the first loading cylinder 410. As illustrated, the seal member 140 contacts a surface of a package 130b of the device under test.

FIG. 5 shows a simplified cross-section top view of another exemplary system 500 having the seal member 140 arranged between the first loading component 110 and the second loading component 120 according to an aspect of the present disclosure. The seal member 140 may be configured as a ring surrounding the first loading component 110 and may be at least partially integrated with the second loading component 120.

Accordingly, a seal member that encloses a cavity above a device (DUT) but still allows for independent load/motion for the package loading (exterior) and die/silicon loading (interior) may be provided all with the use of one simple seal. The seal member also encompasses features that allow for self-retention to prevent reliability failures with repeated socketings.

Figure 6:
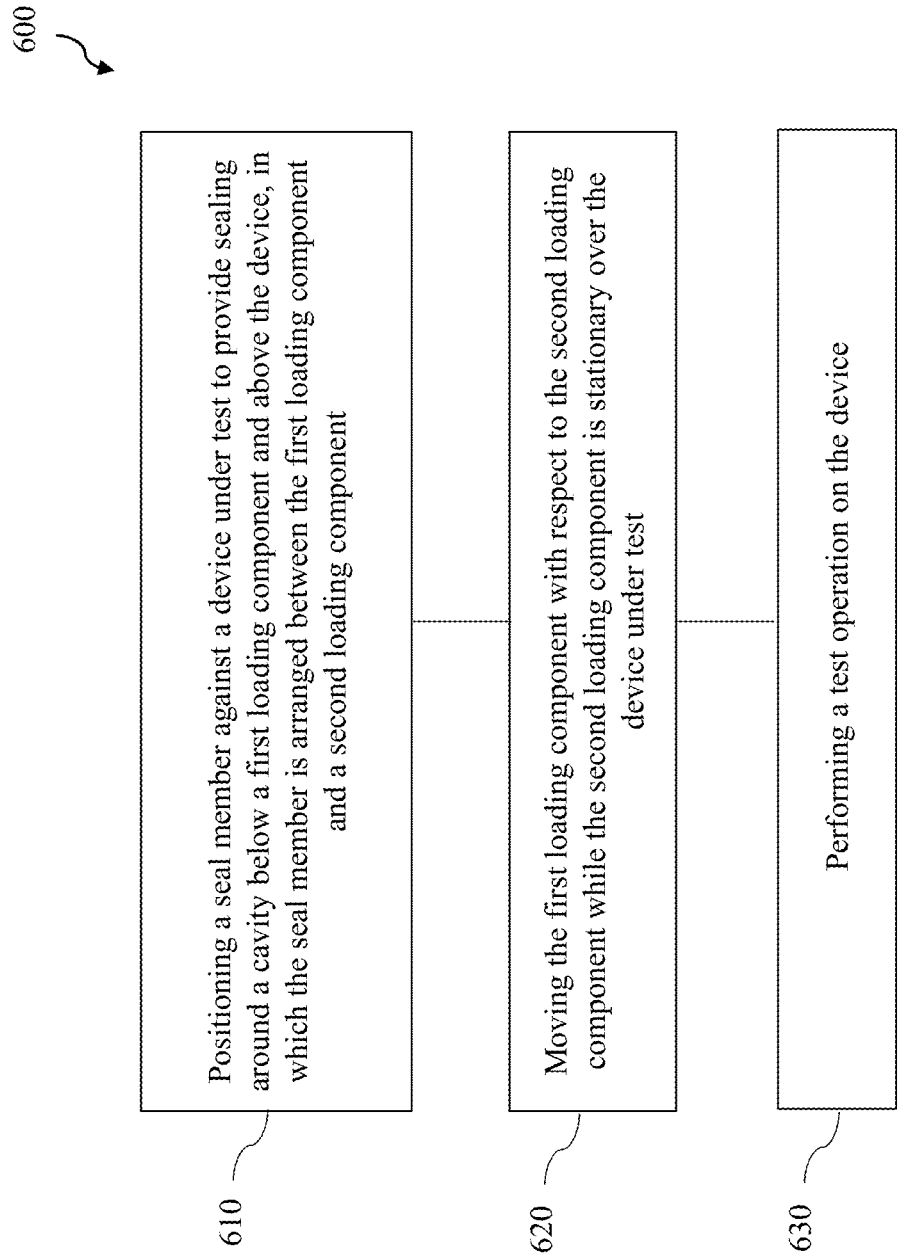
FIG. 6 shows exemplary method according to an aspect of the present disclosure.

FIG. 6 shows an exemplary method 600 according to an aspect of the present disclosure. For example, the method 600 may be used to perform a test on device using the system and/or test apparatus according to various embodiments. At 610, a seal member may be positioned or pressed against a device under test to provide sealing around a cavity below a first loading component and above the device, in which the seal member is arranged between the first loading component and a second loading component. At 620, the first loading component may be moved with respect to the second loading component while the second loading component is stationary over the device under test. For example, the movement of the first loading component may be in a vertical direction relative to the device under test. At 630, a test operation may be performed on the device.

In a non-limiting example, a device (device under test) may be placed in a testing socket. A thermal head may be actuated (e.g., vertically) towards the device. The thermal head may be actuated via a primary cylinder or stage. The seal member as described according to various embodiments may be engaged with the device (e.g., package) by applying load or compression to the seal member. The compression seals both the first loading component and the second loading component to one another and the device. Seal checks (e.g., pressure checks) may be performed to ensure the system is properly closed, e.g., fully sealed. Upon passing the seal checks, fluid may be introduced to the device under test. Pattern testing may be performed under various conditions. After testing completes, fluid may be purged out, for example, using high pressure air. The thermal head may be lifted off the device (e.g., unsealing the environment). The device may be removed from the test socket (e.g., via a robot). Another test unit may be placed in the socket and the cycle repeats.

It will be understood that any property described herein for a specific tool may also hold for any tool or system described herein. It will also be understood that any property described herein for a specific method may hold for any of the methods described herein. Furthermore, it will be understood that for any tool, system, or method described herein, not necessarily all the components or operations described will be enclosed in the tool, system, or method, but only some (but not all) components or operations may be enclosed.

To more readily understand and put into practical effect the present system having the seal member, they will now be described by way of examples. For the sake of brevity, duplicate descriptions of features and properties may be omitted.

EXAMPLES

Example 1 provides a system including a first loading component and a second loading component for applying load to a device during a test of the device, the first loading component is configured to be moveable with respect to the second loading component, and a seal member arranged between the first loading component and the second loading component, the seal member is adapted to engage the device during testing so as to apply a load against the device during testing and provide sealing around a cavity positioned below the first loading component and above the device.

Example 2 may include the system of example 1 and/or any other example disclosed herein, in which the seal member includes first and second opposing surfaces, the second surface is slanted at an angle with respect to a longitudinal axis extending between the first and second surfaces, and engages with a surface of the second loading component, and the first surface of the seal member is adapted to engage the device during testing.

Example 3 may include the system of example 2 and/or any other example disclosed herein, in which the seal member includes first and second opposing sidewalls, the first sidewall comprises a substantially planar first side portion to facilitate vertical movement of the first loading component with respect to a top surface of the device during testing, and the second sidewall comprises a slanted side portion with respect to the planar first side portion of the first sidewall.

Example 4 may include the system of example 3 and/or any other example disclosed herein, for which the seal member comprises a lip portion adapted to mate with a mechanical retention portion in the second loading component to enable the seal member to be retained in place between the first loading component and the second loading component when the first loading component moves.

Example 5 may include the system of example 4 and/or any other example disclosed herein, for which the slanted side portion of the second sidewall adjoins the first surface to form the lip portion of the seal member.

Example 6 may include the system of example 4 and/or any other example disclosed herein, for which the seal member includes a lower section beneath an upper section, in which the first surface is positioned at the lower section and the lip portion is positioned at the upper section, wherein the lower section has a width that is smaller than (or less than) a maximum width of the upper section to facilitate expansion and retention of the seal member.

Example 7 may include the system of example 3 and/or any other example disclosed herein, for which the first side portion of the first sidewall is substantially co-planar with a first sidewall of the second loading component to facilitate movement of the first loading component.

Example 8 may include the system of example 1 and/or any other example disclosed herein, for which the seal member is configured as a ring surrounding the first loading component and is at least partially integrated with the second loading component.

Example 9 may include the system of example 1 and/or any other example disclosed herein, for which the seal member is an elastomeric seal, and is formed of silicon rubber, nitrile, polyurethane, polytetrafluoroethylene or combinations thereof.

Example 10 may include the system of example 1 and/or any other example disclosed herein, for which the device includes a die mounted on a package, and the seal member extends from the second loading component to contact the device during testing along one of package surfaces, including the die, a stiffener, a substrate, an underfill or other components of the device.

Example 11 may include the system of example 1 and/or any other example disclosed herein, for which the first loading component is an inner loading mechanism for loading of the die and the second loading component is an outer loading mechanism for loading of the package of the device during testing.

Example 12 provides a device test apparatus including a thermal head having first and second loading components for applying load to a device during a test of the device, the first loading component is configured to be moveable with respect to the second loading component, one or more fluid channels extending through the first loading component to permit flow of fluid from an external source to a cavity below the first loading component and above the device, a seal member arranged between the first loading component and the second loading component, the seal member engaging the first loading component and the second loading component, the seal member is adapted to engage the device during testing so as to apply a load against the device during testing and provide sealing around the cavity, a test socket adapted to connect to a die of the device during testing, and a controller adapted to drive the testing of the die through the test socket.

Example 13 may include the device test apparatus of example 12 and/or any other example disclosed herein, for which the seal member includes first and second opposing surfaces, the second surface is slanted at an angle with respect to a longitudinal axis extending between the first and second surfaces, and engages with a surface of the second loading component, and the first surface of the seal member is adapted to engage the device during testing.

Example 14 may include the device test apparatus of example 13 and/or any other example disclosed herein, for which the seal member comprises first and second opposing sidewalls, the first sidewall comprises a substantially planar first portion to facilitate vertical movement of the first loading component with respect to a top surface of the device during testing, and the second sidewall comprises a slanted first portion with respect to the planar first portion of the first sidewall.

Example 15 may include the device test apparatus of example 14 and/or any other example disclosed herein, for which the seal member comprises a lip portion adapted to mate with a mechanical retention portion in the second loading component to enable the seal member to be retained in place between the first loading component and the second loading component when the first loading component moves.

Example 16 may include the device test apparatus of example 15 and/or any other example disclosed herein, for which the first portion of the second sidewall adjoins the first surface to form the lip portion of the seal member.

Example 17 provides a method including positioning a seal member against a device under test to provide sealing around a cavity below a first loading component and above the device, in which the seal member is arranged between the first loading component and a second loading component, moving the second loading component with respect to the first loading component while the first loading component is stationary over the device under test, and performing a test operation on the device.

Example 18 may include the method of example 17 and/or any other example disclosed herein, for which the movement of the second loading component is in a vertical direction relative to the device under test.

Example 19 may include the method of example 17 and/or any other example disclosed herein, for which the seal member comprises first and second opposing surfaces, the second surface is slanted at an angle with respect to a longitudinal axis extending between the first and second surfaces, and engages with a surface of the second loading component, and the first surface of the seal member is adapted to engage the device during testing.

Example 20 may include the method of example 19 and/or any other example disclosed herein, for which the seal member comprises first and second opposing sidewalls, the first sidewall includes a substantially planar first side portion to facilitate vertical movement of the first loading component with respect to a top surface of the device during testing, and the second sidewall comprises a slanted side portion with respect to the planar first side portion of the first sidewall.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. A system, comprising:
a thermal head comprising a first loading component and a second loading component for applying load to a device during a test of the device, wherein the first loading component and second loading component are each positioned above the device and configured to be moveable with respect to the device and to one another; and
a seal member arranged between the first loading component and the second loading component, the seal member is adapted to directly engage the device, the first loading component, and the second loading component during testing so as to apply a load against the device during testing and to provide sealing around a cavity positioned below the first loading component and above the device.

2. The system of claim 1, wherein the seal member comprises first and second opposing surfaces, the second surface is slanted at an angle, with respect to a longitudinal axis extending between the first and second surfaces, and directly engages with a surface of the second loading component, and the first surface of the seal member is adapted to directly engage the device during testing.

3. The system of claim 2, wherein the seal member comprises first and second opposing sidewalls, the first sidewall comprises a substantially planar first side portion to facilitate vertical movement of the first loading component with respect to a top surface of the device during testing, and the second sidewall comprises a slanted side portion with respect to the planar first side portion of the first sidewall.

4. The system of claim 3, wherein the seal member comprises a lip portion adapted to mate with a mechanical retention portion in the second loading component to enable the seal member to be retained in place between the first loading component and the second loading component when the first loading component moves.

5. The system of claim 4, wherein the slanted side portion of the second sidewall adjoins the first surface to form the lip portion of the seal member.

6. The system of claim 4, wherein the seal member comprises a lower section beneath an upper section, wherein the first surface is positioned at the lower section and the lip portion is positioned at the upper section, the lower section has a width that is smaller than a maximum width of the upper section to facilitate expansion and retention of the seal member.

7. The system of claim 3, wherein the first side portion of the first sidewall is substantially co-planar with a first sidewall of the second loading component to facilitate movement of the first loading component.

8. The system of claim 1, wherein the seal member is configured as a ring surrounding the first loading component and is at least partially integrated with the second loading component.

9. The system of claim 1, wherein the seal member is an elastomeric seal, and is formed of silicon rubber, nitrile, polyurethane, polytetrafluoroethylene, or combinations thereof.

10. The system of claim 1, wherein the device comprises a die mounted on a package, and the seal member extends from the second loading component to contact the device during testing along one of package surfaces, including the die, a stiffener, a substrate, an underfill or other components of the device.

11. The system of claim 10, wherein the first loading component is an inner loading mechanism for loading of the die and the second loading component is an outer loading mechanism for loading of the package of the device during testing.

12. A device test apparatus, comprising:
a thermal head comprising first and second loading components for applying load to a device during a test of the device, wherein the first loading component and second loading component are each positioned above the device and configured to be moveable with respect to the device and to each other loading component;
one or more fluid channels extending through the first loading component to permit flow of fluid from an external source to a cavity positioned below the first loading component and above the device;
a seal member arranged between the first loading component and the second loading component, the seal member engaging the first loading component and the second loading component, the seal member is adapted to directly engage the device, the first loading component and the second loading component during testing so as to apply a load against the device during testing and provide sealing around the cavity;
a test socket adapted to connect to a die of the device during testing; and
a controller adapted to drive the testing of the die through the test socket.

13. The device test apparatus of claim 12, wherein the seal member comprises first and second opposing surfaces, the second surface is slanted at an angle with respect to a longitudinal axis extending between the first and second surfaces, and directly engages with a surface of the second loading component, and the first surface of the seal member is adapted to directly engage the device during testing.

14. The device test apparatus of claim 13, wherein the seal member comprises first and second opposing sidewalls, the first sidewall comprises a substantially planar first side portion to facilitate vertical movement of the first loading component with respect to a top surface of the device during testing, and the second sidewall comprises a slanted side portion with respect to the planar first side portion of the first sidewall.

15. The device test apparatus of claim 14, wherein the seal member comprises a lip portion adapted to mate with a mechanical retention portion in the second loading component to enable the seal member to be retained in place between the first loading component and the second loading component when the first loading component moves.

16. The device test apparatus of claim 15, wherein the slanted portion of the second sidewall adjoins the first surface to form the lip portion of the seal member.

17. A method, comprising:
positioning a seal member against a device under test to provide sealing around a cavity below a first loading component and above the device, wherein the seal member is arranged between the first loading component and a second loading component, wherein the first loading component and the second loading component are each arranged above the device and movable with respect to the device and to one another;
moving the second loading component with respect to the first loading component at a time while the first loading component is stationary over the device under test;
contacting directly with the seal member the device, the first loading component and the second loading component by the moving of the second loading component; and
performing, during the contacting, a test operation on the device.

18. The method of claim 17, wherein the movement of the second loading component is towards the device under test in a vertical direction relative to the device under test, wherein the movement also causes the seal member to directly engage a surface of the first loading component along the vertical direction to provide part of the sealing around the cavity.

19. The method of claim 17, wherein the seal member comprises first and second opposing surfaces, the second surface is slanted at an angle with respect to a longitudinal axis extending between the first and second surfaces, and directly engages with a surface of the second loading component, and the first surface of the seal member is adapted to directly engage the device during testing.

20. The method of claim 19, wherein the seal member comprises first and second opposing sidewalls, the first sidewall comprises a substantially planar first side portion to facilitate vertical movement of the first loading component with respect to a top surface of the device during testing, and the second sidewall comprises a slanted side portion with respect to the planar first side portion of the first sidewall.

* * * * *